United States Patent
Halope

(10) Patent No.: US 7,337,975 B2
(45) Date of Patent: Mar. 4, 2008

(54) METHOD FOR PRODUCING A CONTACTLESS TICKET COMPRISING A CHIP

(75) Inventor: Christophe Halope, Cannes (FR)

(73) Assignee: Ask S.A., Valbonne (FR)

( * ) Notice: Subject to any disclaimer, the term of this patent is extended or adjusted under 35 U.S.C. 154(b) by 179 days.

(21) Appl. No.: 10/556,486

(22) PCT Filed: May 26, 2004

(86) PCT No.: PCT/FR2004/001299

§ 371 (c)(1),
(2), (4) Date: Nov. 14, 2005

(87) PCT Pub. No.: WO2004/107260

PCT Pub. Date: Dec. 9, 2004

(65) Prior Publication Data

US 2007/0029391 A1 Feb. 8, 2007

(30) Foreign Application Priority Data

May 26, 2003 (FR) .................................. 03 06309

(51) Int. Cl.
*G06K 19/06* (2006.01)

(52) U.S. Cl. ...................... 235/492; 235/435; 235/451; 361/737

(58) Field of Classification Search ................ 235/435, 235/451; 361/737

See application file for complete search history.

(56) References Cited

U.S. PATENT DOCUMENTS

| 6,147,662 | A | 11/2000 | Grabau et al. | 343/895 |
|---|---|---|---|---|
| 6,437,985 | B1 | 8/2002 | Blanc et al. | 361/749 |
| 6,459,588 | B1 * | 10/2002 | Morizumi et al. | 361/737 |
| 6,575,374 | B1 * | 6/2003 | Boyadjian et al. | 235/492 |
| 2003/0052177 | A1 | 3/2003 | Halope | 235/492 |

FOREIGN PATENT DOCUMENTS

| WO | WO 99/17252 | 4/1999 |
|---|---|---|
| WO | WO 03/025850 | 3/2003 |

* cited by examiner

*Primary Examiner*—Seung Ho Lee
(74) *Attorney, Agent, or Firm*—James C. Lydon

(57) ABSTRACT

A multi-step method for producing contactless tickets or cards, the tickets or cards including a chip (24) which is connected to an antenna (10) on a paper carrier. The method includes: printing the antennae in series on the paper carrier strip using a silkscreen ink; fixing a chip to each ticket by connecting bond pads of the chip to the antennas' bond pads (14, 16); and covering the paper strip, including the silkscreen-printed antenna and the corresponding chip, with an adhesive paper strip. After each step, the paper carrier strip is wound up before the next step is begun. Each of the silkscreen-printed antennae is coated with a protective layer (12) to prevent silkscreen ink from being transferred to the back of the paper carrier strip during the successive winding-up following each step.

7 Claims, 1 Drawing Sheet

METHOD FOR PRODUCING A CONTACTLESS TICKET COMPRISING A CHIP

TECHNICAL FIELD

The present invention relates to a method of manufacturing a ticket provided with a chip and a screen-printed antenna and relates in particular to a method of manufacturing a contactless ticket and the ticket produced from this method.

BACKGROUND ART

Contactless, radio frequency identification (RFID)-type electronic tickets more commonly known as contactless readable tickets or contactless readable tags are equipped with an antenna and an integrated circuit in the form of an electronic chip connected to the antenna, the unit being produced on a flexible support. Contactless-type electronic tickets can remotely exchange and transmit data via inductive coupling, by means of their antenna using a reader also equipped with an antenna. The flexible support is made of paper, card or plastic. In an economical embodiment of the tickets, the antenna is printed by screen printing. Screen printing consists in printing the antenna coils on an electrically insulating substrate, preferably made of paper, using a conductive ink, for example, made up mainly of silver powder. It is possible to use a continuous manufacturing method to manufacture tickets equipped with screen-printed antennas.

Thus, the applicant has personally developed a manufacturing method in which screen printing of the antenna is carried out on one side of an endless paper strip, the width of which allows the manufacture of one or more tickets. On the reverse side of the paper strip to the side bearing the antenna, markers made up of printed marks or holes are made in the feed direction of the paper strip such that the area corresponding to each ticket and possibly the rows of tickets in the width of the paper strip can be located. These markers are essential to the method for continuously manufacturing the tickets. Indeed, at each ticket manufacturing stage, since the paper strip is completely unwound then rewound so that it can be handled and stored between two manufacturing steps, the exact position of each ticket is located. Thus, the method of continuously manufacturing the contactless tickets is broken down into a number of steps consisting of printing the client illustration, printing the antenna, installing the chip and carrying out the final lamination which consists in depositing the layer preprinted with the client illustration on the ticket side bearing the antenna and the chip. Printing the antenna requires several runs. Indeed, the production of the antenna consists in printing the coils of the antenna forming a conductive spiral, producing a dielectric strip perpendicular to the coils and printing a conductive ink bridge on the dielectric strip allowing one of the ends of the antenna to be connected to the connection terminal which will be used to provide for electrical connection with the chip.

The step consisting in positioning the electronic chip on the tickets at the location provided in order to be connected to the antenna is an essential step in the manufacture of the ticket and requires a high degree of precision. The chip is placed exactly at the desired place as a result of the markers already set out on the opposite side of the support of the antenna and of optic detection of the markers. However, positioning may be carried out wrongly and, in this case, the connection of the chip to the antenna is defective. The markers are also used for cutting the strip into unit tickets.

The major disadvantage of this type of continuous manufacturing method is that the silver ink making up the antenna is transferred by friction onto the back of the paper strip during the successive windings and unwindings which are necessary in order to complete ticket manufacture. When the back of the paper strip is preprinted with the client illustration, a mark appears, which can be seen by the naked eye, on the client illustration, which impairs the final aesthetic quality of the ticket. Furthermore, the transfer of ink could also cover the markers on the back of the paper strip in the instance where these are in the area of the antenna and thus hamper the optical location carried out during the ticket manufacturing and distribution steps. Thus, the steps which consist in positioning the chip and cutting the tickets could fail and cause a reduction in the ticket production output.

SUMMARY OF THE INVENTION

The aim of the invention is therefore to overcome these disadvantages by providing a method of continuously manufacturing contactless tickets on an endless strip allowing for the production of the antenna by conductive ink screen printing without the ink being transferred by friction onto the back of the strip and without adding additional ticket manufacturing steps.

The object of the invention is therefore a method for the multi-step manufacture of contactless tickets or cards including a chip connected to an antenna on a paper support, and consisting in printing in series, using screen printing ink, the antennas on the paper support strip, in fixing a chip on each ticket by connecting the bonding pads of the chip to the bonding pads of the antenna and covering the paper strip comprising the screen-printed antennas and the corresponding chips with an adhesive paper strip, each of the steps being followed by the winding of the paper support strip before moving on to the next step. The method includes a step for covering each of the screen-printed antennas with a protection layer for preventing the screen printing ink from being transferred onto the back of the paper support strip during the successive windings thereof after each step.

BRIEF DESCRIPTION OF THE FIGURES

The aims, objects and characteristics of the invention will become more clearly apparent on reading the following description with reference to the drawings, in which.

DETAILED DESCRIPTION OF THE INVENTION

In the contactless ticket manufacturing method according to the invention, each step consists in carrying out an identical operation on an endless strip, the width of which allows for the manufacture of one or more tickets at the same time (for example 6 tickets). When all of the steps have been carried out, cutting takes place in order to obtain individual tickets.

Figure 1:
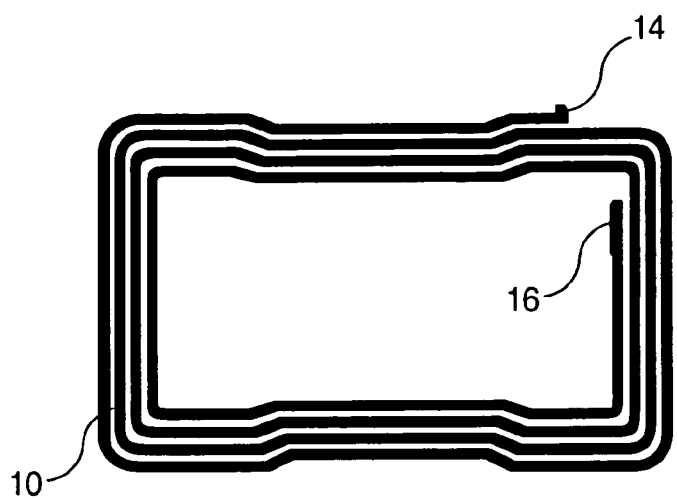
FIG. 1 shows the antenna of a contactless ticket which has been produced by printing a screen printing ink.

Prior to the first step of the manufacturing method, a reel of a length of a plain paper strip is installed in the manufacturing machine. The reel is unwound in order to carry out the first step with consists in producing antenna 10 by screen printing using a silver-based ink illustrated in FIG. 1.

Figure 2:
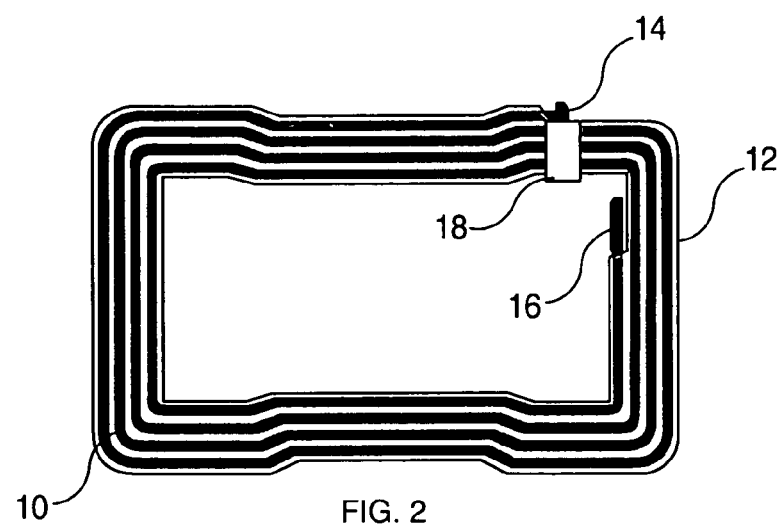
FIG. 2 shows the antenna covered with a dielectric protection layer produced according to the principles of the invention.

The next step consists in depositing, still by screen printing, a protective layer 12 which covers the antenna 10. In the preferred embodiment illustrated in FIG. 2, the protective layer is applied over the whole surface of antenna 10 so as to cover the latter. However, an embodiment can be designed in which the protective layer only covers antenna turns, that is to say its exact imprint. Still according to the preferred embodiment, the protective layer is a dielectric layer.

The purpose of this protective layer is to prevent the frictional transfer of the ink making up antenna 10 which has just been fixed onto the paper strip during the subsequent windings of the strip which follow the screen printing step.

As mentioned above, such a transfer impairs the final aesthetic quality of the ticket and is likely to cover the markers set out on the back of the strip and therefore to hamper the optical location thereof.

This dielectric layer has two features. Firstly, it must not cover ends 14, 16 of the antenna which will be used as connections with the chip. Secondly, this single-step screen printing of the dielectric is not the same for a rectangle 18 onto which, in the following step, a conductive strip for connecting end 14 of the antenna to the bonding pad of the chip will be printed.

Dielectric layer 12 is preferably printed during the same step as the antenna is screen printed to thereby prevent the transfer of the ink onto the back of the ticket. However, such printing of the dielectric layer could also be carried out in a subsequent step, i.e. after winding the strip which has just been screen printed with the antenna.

As already mentioned, printing the dielectric layer is different for rectangle 18 covering the coils of the antenna. Indeed, the sole purpose of the layer of dielectric over the entire antenna is to prevent the transfer of the ink onto the back of the tickets, whereas the purpose of the dielectric of rectangle 18 is to insulate the coils of the antenna from conductive strip 20 illustrated in FIG. 3. This rectangle must therefore be perfectly electrically insulating which is not necessarily a requirement for all of the dielectric layer produced for protective purposes. One preferred technique consists in using a print screen, the majority of which is half-tone printed except for the part corresponding to rectangle 18 which is a full-tone screen. This allows for a cover of 100% dielectric for rectangle 18 and only 30% dielectric for the rest of dielectric layer 12.

Figure 3:
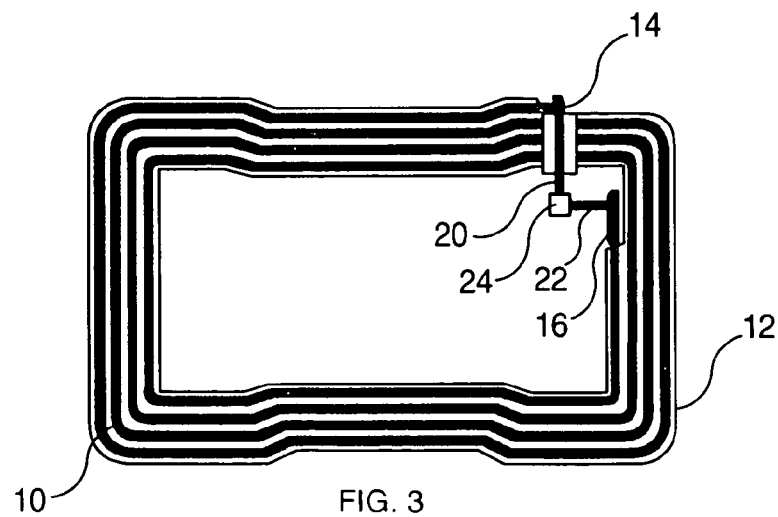
FIG. 3 shows the ticket with the screen-printed antenna covered with the dielectric layer following the step of fixing the chip by connection to the ends of the antenna.

After the strip has been wound again, the method proceeds to the following step which consists in screen printing the connections from the antenna to the chip, i.e. conductive strip 20 from end 14 of antenna 10 and a conductive strip 22 from end 16 of the antenna. As illustrated in FIG. 3, this allows the connection of chip 24 in the following step, by fixing the bonding pads of the chip onto the ends of conductive strips 20 and 22.

It should be noted that the screen printing of conductive bands 20 and 22 after printing the protective dielectric layer 12 does not present the same ink transfer problem as the antenna. Indeed, the longitudinal coils of the antenna are located above one another in the reel after winding, therefore creating an excess thickness and, consequently, an increased risk of the frictional transfer of ink onto the back of the tickets due to the pressure caused by this excess thickness. By contrast, both conductive strips 20 and 22, with reduced dimensions, are not located at the same place in the reel resulting from the strip being wound. Therefore, there is no excess thickness and, consequently, little risk of frictional transfer of ink onto the back of the tickets.

Although the method according to the invention has been described with reference to the manufacture of paper tickets, it could also be applied to the manufacture of contactless cards or any other contactless-type objects (labels, tags, etc.) in which the antenna is produced using a screen printing ink.

The invention claimed is:

1. A method for the multi-step manufacture of contactless tickets or cards including a chip connected to an antenna on a paper support, said method comprising printing in series, using screen printing ink, antennas on a paper support strip, in fixing a chip on each ticket by connecting the bonding pads of the chip to the bonding pads of the antenna and in covering said paper support strip comprising the screen-printed antennas and the corresponding chips with an adhesive paper strip, each of the steps being followed by the winding of said paper support strip before moving onto the next step;
   wherein said method includes a step comprising covering each of said screen-printed antennas with a protective layer, applied by printing, said protective layer being provided for preventing the screen printing ink from being transferred onto the back of the paper support strip during the successive windings thereof after each step.

2. The method according to claim 1, wherein said protective layer is a dielectric layer.

3. The method according to claim 2, wherein said dielectric layer is printed using a screen printing ink during screen printing the antenna onto the paper support.

4. The method according to claim 3, wherein a part of said dielectric layer adapted to receive a conductive strip connecting the end of the screen-printed antenna to a bonding pad of the chip is greater than the rest of said dielectric layer.

5. The method according to claim 4, wherein said part of the dielectric layer adapted to receive said conductive strip is made up of 100% dielectric, whereas the rest of said dielectric layer is made up of 30% dielectric.

6. The method according to claim 5, wherein said print screen which is used to produce said dielectric layer comprises a full-tone screen corresponding to said part adapted to receive said conductive strip, whereas the rest of said dielectric layer is half-tone printed.

7. The method according to claim 1, wherein said protective layer is applied by screen printing to said antenna.

* * * * *